United States Patent [19]
Brown et al.

[11] Patent Number: 5,119,047
[45] Date of Patent: Jun. 2, 1992

[54] STRIPLINE SHIELDING AND GROUNDING SYSTEM

[75] Inventors: Kenneth W. Brown, Yucaipa; Ricky M. Nelson, Riverside, both of Calif.

[73] Assignee: General Dynamics Corp., Air Defense Systems Div., Pomona, Calif.

[21] Appl. No.: 615,677

[22] Filed: Nov. 19, 1990

[51] Int. Cl.⁵ .............................................. H05K 9/00
[52] U.S. Cl. ............................... 333/12; 174/35 R; 361/424; 333/246
[58] Field of Search ........................ 333/12, 238, 246; 174/35 R, 35 GC; 361/424

[56] References Cited

U.S. PATENT DOCUMENTS

| | | |
|---|---|---|
| 3,533,023 | 10/1970 | Friend et al. ............... 333/246 |
| 3,614,546 | 10/1971 | Avins. |
| 3,721,746 | 3/1973 | Knappenberger ........... 361/424 X |
| 3,757,342 | 9/1973 | Jasik et al. |
| 4,063,246 | 12/1977 | Greiser. |
| 4,331,285 | 5/1982 | Gottwals. |
| 4,514,586 | 4/1985 | Waggoner. |
| 4,609,104 | 9/1986 | Kasper et al. |
| 4,647,714 | 3/1987 | Goto. |
| 4,670,347 | 6/1987 | Lasik et al. |
| 4,684,954 | 8/1987 | Sureau et al. |
| 4,829,432 | 5/1989 | Hershberger et al. |
| 4,845,310 | 7/1989 | Postupack. |
| 5,014,160 | 5/1991 | McCoy, Jr. ............... 174/35 GC X |
| 5,043,848 | 8/1991 | Rogers et al. ............ 174/35 R X |

FOREIGN PATENT DOCUMENTS 3133441 8/1981 Fed. Rep. of Germany.
286399 11/1989 Japan ....................... 361/424

Primary Examiner—Paul Gensler
Attorney, Agent, or Firm—Sheldon & Mak

[57] ABSTRACT

A stripline circuit grounding and shielding system has specially configured ground plane foil sheets that are applied to opposite sides of a module substrate. The sheets extend beyond perimeter edges of the substrate, being folded into overlapping contact and soldered together. Intersecting slits made in the sheets permit tab portions of each sheet to be formed about protruding circuit components of the module. Cover plates on each side of the module have cavities for receiving the protruding component portions, together with the sheet tab portions, which are biased against the components by spring members that are also retained by the cavities. The soldered edges of the sheets provide excellent EMI shielding, while the tab portions provide short, low resistance ground paths for the components, without introducing harmful air gaps, because no soldering is done at the ground planes of the sheets.

14 Claims, 5 Drawing Sheets

STRIPLINE SHIELDING AND GROUNDING SYSTEM

BACKGROUND

The present invention relates to grounding and shielding of electronic circuitry, and more particularly to the grounding of circuitry that incorporates stripline and similar technology.

With reference to FIGS. 1 and 2, a conventional stripline circuit module 10 has a board or substrate 11 that has internal conductive circuit traces 12 that intersect component cavities 13 of the substrate 11. Thin conductive metal ground planes 14 are applied to opposite sides of the substrate 11, the cavities 13 also forming openings in the ground planes 14. Electronic components 15 are inserted into the cavities 13, the components 15 being electrically connected by soldering leads 16 thereof to exposed ends of the traces 12 in the sides of the cavities 13, the components 15 also typically protruding from opposite sides of the substrate 11 through the ground planes 14. Metal cover plates 17 are fastened to the ground planes 14, cover cavities 18 being formed part way through the plates 17 for receiving the protruding portions of the components 15. An elastomeric or conductive spring 19 within each cover cavity 18 grounds the associated component 15 to the plate 17, which is also grounded to the connected ground plane 14 by contact therewith, thereby creating a component grounding path from the component 15 to the ground plane 14 as indicated by the arrow in FIG. 2.

One problem with the configuration of FIGS. 1 and 2 is that the component 15 does not ground directly to the ground plane 14, thereby degrading the component grounding at higher frequencies wherein the wavelength is of the same order as the length of the component grounding path. Also, the edges of the module 10 are exposed dielectric material which may radiate or conduct EMI to or from adjacent stripline boards or some other outside receiver or source.

FIGS. 3 and 4 further show foil tabs 20 that are soldered to the ground plane 14 next to the components 15, the foil tabs 20 being folded respectively over the top and bottom of the components 14. The springs 19 in the cover cavities 18 press the tabs 20 against the components 15 such that the length of the grounding path from the component 15 to the ground plane 14 is greatly reduced. This configuration disadvantageously results in an air gap between the cover plate 17 and the ground plane 14, as shown at 21 in FIG. 4, the air gap 21 degrading the effectiveness of the ground plane 14 in the areas around the air gap 21, and causing EMI from one area of the module 10 to be transmitted to another area of the module 10 through the air gap 21. Further, because the foil tab 20 is soldered directly on the ground plane 14 which must remain as smooth as possible with evenly thick patches of solder, the soldering is critical and involves intensive labor.

To protect a stripline module against EMI from external sources, the edge of the substrate 11 must be sealed with metal. There are many traditional methods to edge seal stripline modules, but each method has the disadvantage of high cost and/or degraded performance.

Perhaps the best method to EMI shield a stripline board in the prior art is shown in FIG. 5. The substrate 11 is enclosed in a box 22 and lid 23, instead of cover plates. The box 22 provides superior protection against EMI due to its thickness, but costs much more than cover plates due to additional material and machining. The box 22 also increases the size of the module 10 significantly, which limits its application. The box 22 by itself does not degrade performance of the substrate 11, but if it is used in conjunction with the foil tabs 20 of FIGS. 3 and 4 for improved component grounding, the performance is degraded due to the air gaps 21 as described above.

FIGS. 6 and 7 show a common method to EMI shield a stripline module. A foil strip 24 is soldered to one ground plane 14, wrapped around the substrate 11 and soldered to the other ground plane 14. This "foil wrap" method induces air gaps 25 between the cover plates 17 and the ground planes 14 which cause the same problems as the foil tab induced air gaps 21, discussed above in connection with FIGS. 3 and 4. Like the foil tabs 20, the foil strips 24 are soldered directly on the ground plane 14, which must remain as smooth as possible and have no uneven patches of solder. Therefore, this soldering is critical and labor intensive. One way to eliminate the air gaps 25 associated with the foil wrap method is to machine a shallow channel along the edges of the cover plates 17 to accommodate the thickness of the foil strip 24. This, of course, adds additional cost to the cover plates 17 due to the additional machining and does not eliminate the air gaps 21 if the foil tabs 20 are used to ground the components 15.

Another method to EMI shield stripline substrates is to plate metal on the edge of the substrate 11. As shown in FIGS. 8 and 9, an edge plating 26 is formed along the perimeter of the substrate 11. The plating process and associated masking, however, is expensive. Also, edge plating by itself does not degrade the performance of the substrate 11, but if it is used in conjunction with the foil tabs 20, the performance is degraded due to the air gaps 21, discussed above.

Other methods for EMI shielding of stripline boards include painting the edge of the substrate 11 with conductive paint, inserting eyelets around the edge of the substrate 11, or inserting a conductive gasket around the edge of the substrate 11. These methods, due to size constraints, cost, or performance, are not commonly used.

Thus there is a need for a stripline shielding and grounding system that does not exhibit the above disadvantages, that is reliable, effective, and inexpensive to use.

SUMMARY

The present invention is directed to a grounding and shielding system for stripline circuitry that meets this need by using specially configured foil sheets. In one aspect of the invention, the system provides a shielded electric circuit module including a substrate means of dielectric material having at least one substrate cavity formed in an external surface of the substrate for receiving a circuit element; trace means insulated within the substrate means for defining circuit paths to the circuit element; and a thin conductive sheet member for covering the external surface, the sheet member extending at least partially over the substrate cavity for shielding at least a portion of the circuit element. The sheet member can extend beyond a marginal edge boundary of the external surface, forming an edge flap formed proximately against an edge surface of the substrate means that intersects the external surface. The substrate means can have a pair of the external surfaces on its opposite sides, one of the sheet members covering each of the surfaces. Preferably the sheet members have respective edge flaps in overlapping electrically conductive contact along a substantial perimeter length of the edge surface for shielding the substrate means.

The module can also include a cover member for covering the external surface, the cover member having a cover cavity formed therein for receiving a protruding portion of the circuit element together with a portion of the sheet member. A pair of the cover members can cover corresponding sheet members on opposite sides of the module. The sheet member can have a sheet circuit opening therein extending over a portion of the cavity for facilitating the forming of the sheet member in close conformity with the protruding portion of the circuit element. The sheet circuit opening can be configured as an intersecting pair of slots that extend proximately to opposite sides of the cavity. The opening formed by the cavity can be rectangular, the slots extending to proximate opposite corners of the opening. The opening formed by the cavity can also be circular, the sheet circuit opening forming an intersecting triplet of the slots.

In another aspect of the invention, the module includes the substrate means including dielectric material having a pair of external surfaces and circuit means electrically insulated therein; and a pair of the thin conductive sheet members extending beyond a marginal edge boundary intersecting the external surfaces, each sheet member including an edge flap in overlapping electrically conductive contact with the other flap along a substantial perimeter length the substrate means for shielding the substrate means along the edge surface.

DRAWINGS

These and other features, aspects, and advantages of the present invention will become better understood with reference to the following description, appended claims, and accompanying drawings, where:

Figure 3:
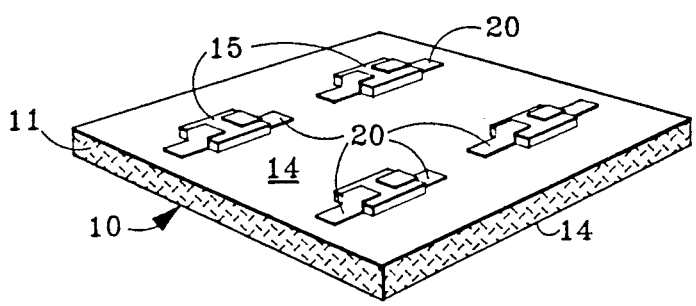
FIG. 3 is an oblique elevational perspective view showing an alternative prior art configuration of the module of FIG. 1.
Figure 4:
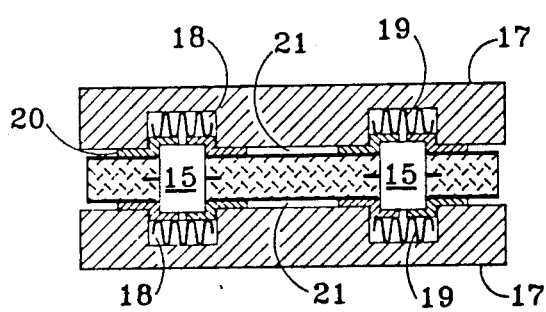
FIG. 4 is an elevational sectional view as in FIG. 2, showing the module of FIG. 3.
Figure 8:
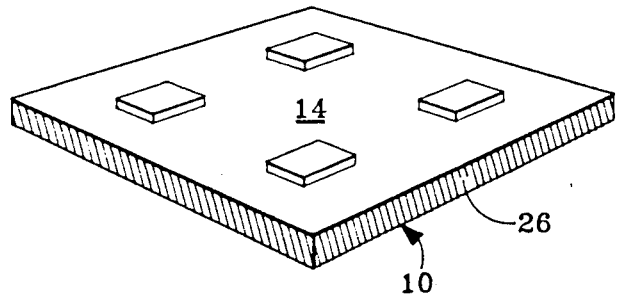
FIG. 8 is an oblique elevational perspective view showing a further prior art configuration of the module of FIG. 1.
Figure 9:
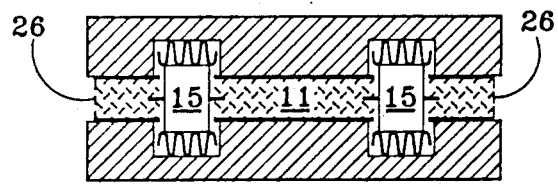
FIG. 9 is an elevational sectional view as in FIG. 2, showing the module of FIG. 8.
Figure 10:
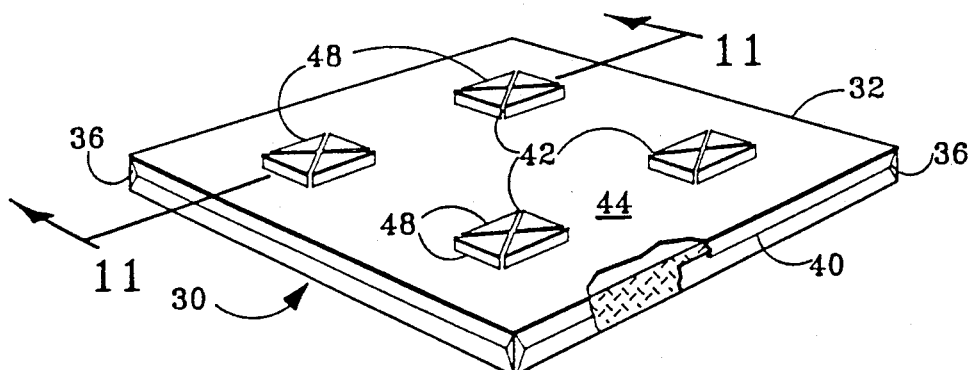
FIG. 10 is an oblique elevational perspective view of a stripline module according to the present invention.
Figure 11:
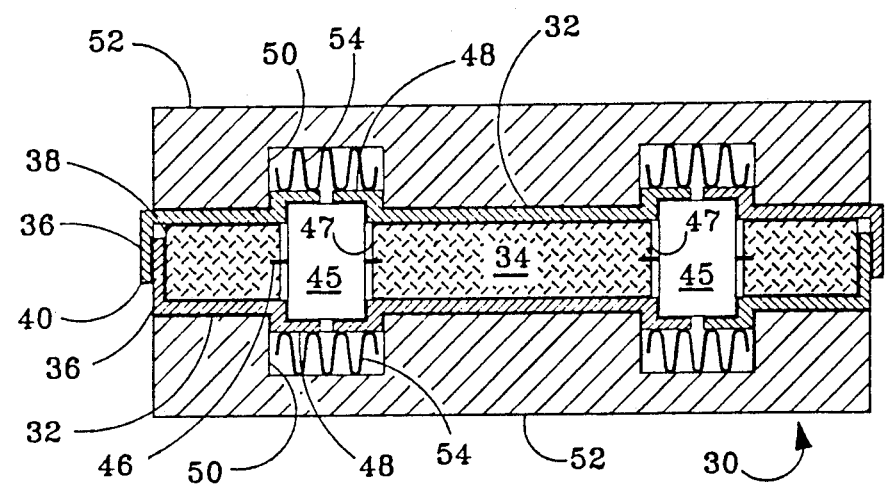
FIG. 11 is a sectional elevational view on line 11—11 of FIG. 10, showing grounding provisions for components of the module in further accordance with the present invention.
Figure 14:
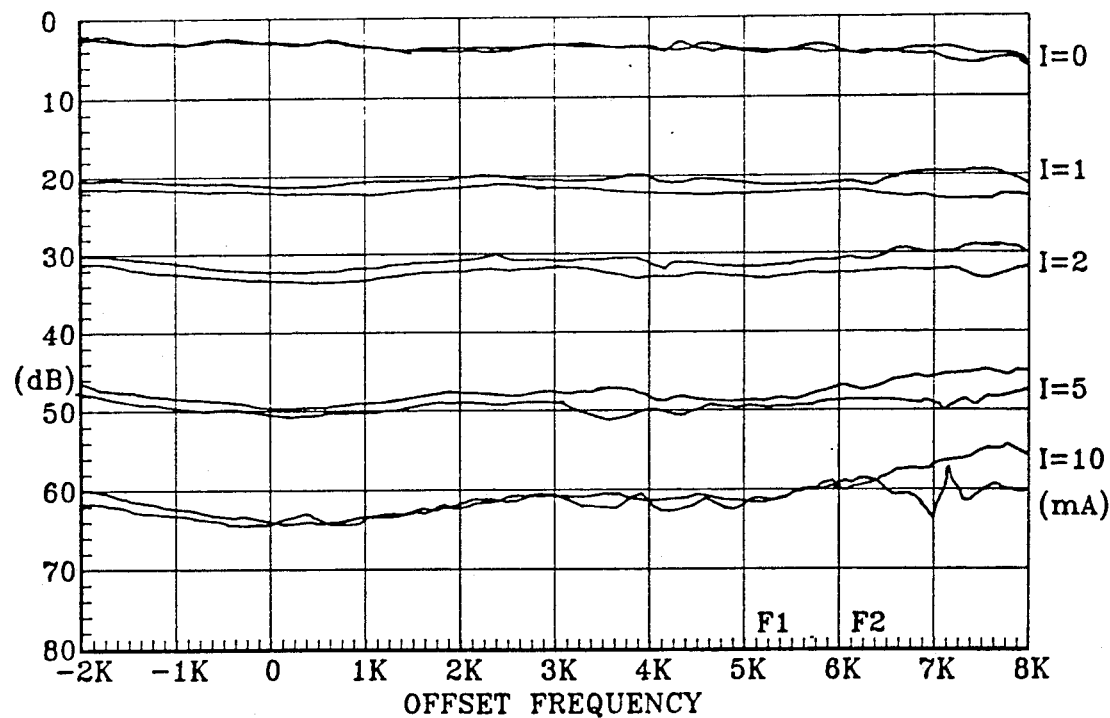
Figure 15:
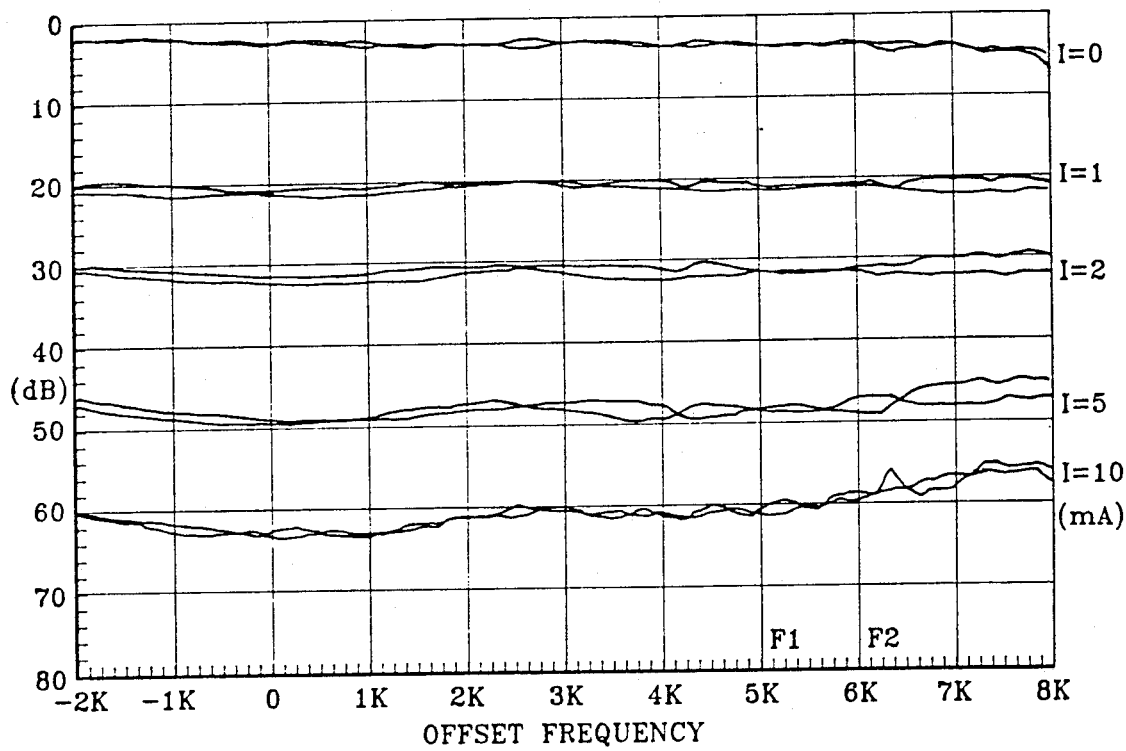

FIG. 14 is graph of attenuation versus frequency of a stripline attenuator circuit module in a combination of the configuration of FIGS. 8 and 9 with the configuration of FIGS. 3 and 4; and FIG. 15 is graph of attenuation versus frequency of a stripline attenuator circuit module in the configuration of FIGS. 10 and 11.

DESCRIPTION

Figure 1:
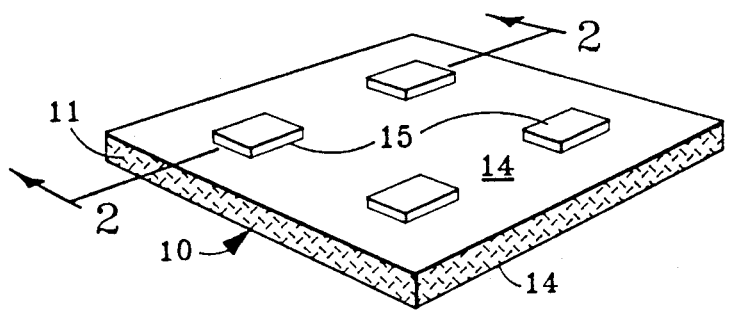
FIG. 1 is an oblique elevational perspective view of a prior art stripline module.
Figure 2:
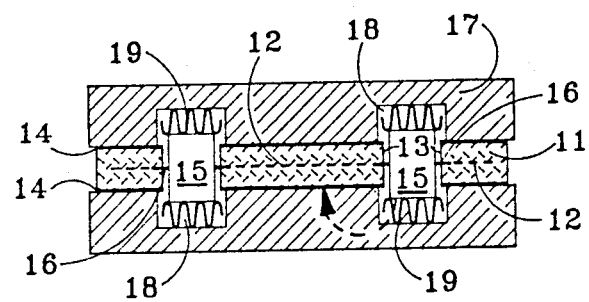
FIG. 2 is a sectional elevational view on line 2—2 of FIG. 1, showing conventional grounding provisions for components of the module.

The present invention is directed to a method that combines stripline board EMI shielding and component grounding into one step. With reference to the drawings, and FIGS. 10 and 11 in particular, a stripline module 30 includes a large foil sheet 32 that is photo engraved to conform with a stripline board 34. The foil sheet 32 is over-sized so that its extremities, designed sheet extremities 36 in the drawings, can be flapped or folded over an edge 38 of the stripline board 34 and soldered to a corresponding extremity 36 of an opposite side counterpart of the sheet 32, forming a double layer of foil as indicated at 40. The foil sheet 32 has slits 42 formed therein on a ground plane 44 for permitting the sheet 32 to be physically formed about one or more stripline components 45 for electrically grounding the components 45. The components 45, having component leads 46, are installed in the board 34 using conventional methods such as described above in connection with FIGS. 1 and 2.

The slits 42 are engraved in cross patterns creating a plurality of pointed tab portions 48, for accommodating each of the stripline components 45. The tab portions 48 are formed upwardly at the sides of the components 45, then folded across the tops (or bottoms) of the components 45 for providing a short grounding path to the ground plane 44. As shown in FIG. 11, the tops (and bottoms) of the components 45 extend together with the tab portions 48 into component cavities 50 of a pair of cover or spacer plates 52 for the module 30. An elastomeric or metallic spring 54 that is retained in each component cavity 50 biases the tab portions 48 into contact with the associated components 45 for effective grounding thereof. The sheet 32 can be engraved so that the components 45 are grounded on all sides. For example, two of the slits 42 are made over rectangular components as shown in FIG. 10. Thus, all soldering on the ground plane 44 is eliminated and a continuous uniform thickness is created over the entire surface of the ground plane 44. Therefore, no air gaps or their associated problems exist adjacent to the ground plane 44 with this method. Since the soldering is at the edge 38 of the stripline board 34, not on the ground plane 44, the soldering can be non-uniform and therefore done quickly, the double layer of foil 40 providing excellent EMI protection.

Figure 12:
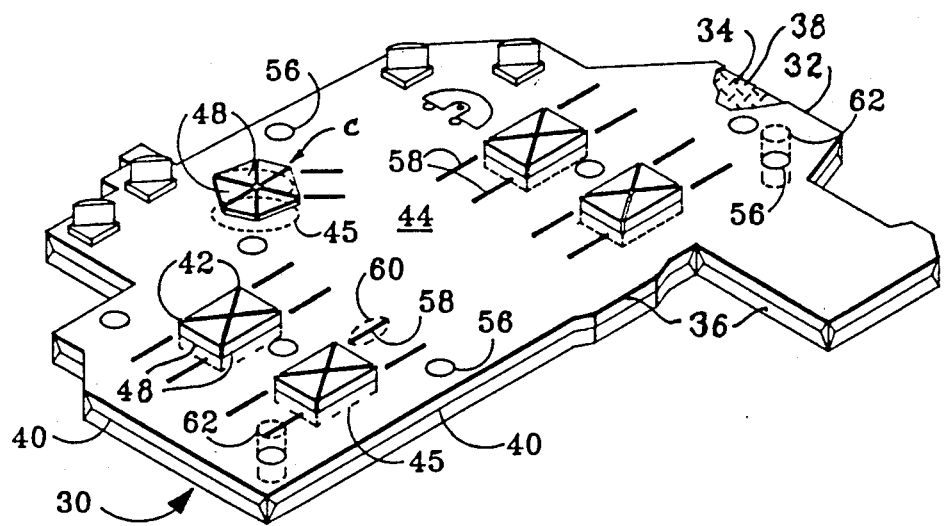
FIG. 12 is an oblique elevational perspective view showing a typical complex configuration of the module of FIG. 10.

With further reference to FIG. 12, the foil sheet 32 can be precision photo engraved for use in the stripline module 30, even when the board 34 has a complex outline and a variety of configurations of the components 45. As shown in FIG. 12, the sheet 32 has the sheet extremity 36 engraved to conform with the complexly shaped edge of the stripline board 34. While two of the slits 42 are typically made over rectangular components as discussed above in connection with FIG. 10, three of the slits 42 (60° apart) are made at locations of circular ones of the components 45, as indicated at o in FIG. 12. Access holes 56 are also engraved in the sheets 32 for accommodating connectors, screw holes, etc. Further, access slots 58 can be engraved over component lead areas 60 for allowing the components 45 to be removed and replaced without removing the sheets 32.

The sheets 32 can be installed on the stripline board 34 relatively quickly. The sheets 32 are placed on both sides of the stripline board 34 and sandwiched between spacer plates 52 (or a fixture that mimics the spacer plates 52). Accurate registration of the sheets 32 on the board 34 is assured by the use of a pair of dowel pins 62 that closely fit spaced ones of the access holes 56, the holes 56 being made the same size as corresponding openings (not shown) in the board 34. The extremities 36 of the sheet 32 are then flapped or folded over the edges 38 of the board 34 and soldered installed on a complexly configured stripline board 34 as depicted in FIG. 12 in less than 30 minutes.

Figure 13:
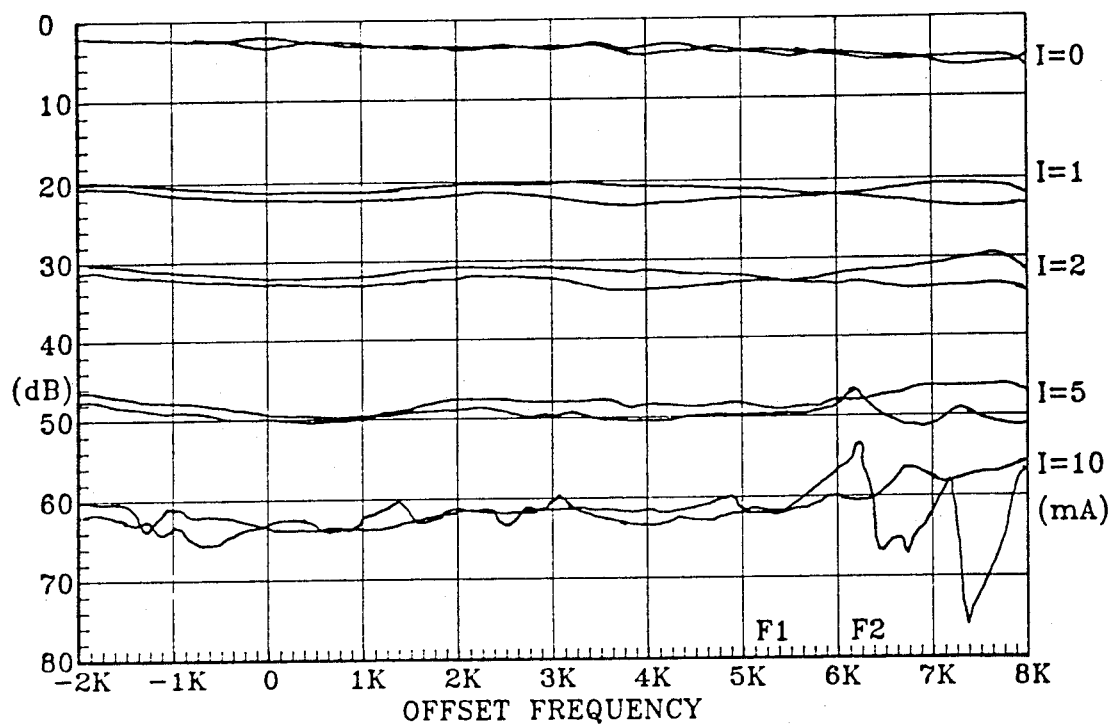
FIG. 13 is graph of attenuation vs. frequency of a stripline attenuator circuit module in the configuration of FIGS. 3 and 4.

With further reference to FIGS. 13-15, the preliminary performance of the present invention has been tested and found superior to an edge plate and foil tab combination as described above in connection with FIGS. 3 and 4 (foil tabs) and FIGS. 8 and 9 (edge plating). The comparison was done on a RAM attenuator board having two separate current controlled attenuators for operation over the I and J frequency bands. FIGS. 13-15 show attenuation vs. frequency graphs for both attenuators and current levels of 0, 1, 2, 5, and 10 mA. It is required that both attenuators have well matched characteristics, or in other words, at any one frequency and current the attenuation of one attenuator must nearly equal that of the other attenuator. EMI from one side of the stripline attenuator board to the other will cause the attenuators' characteristics to be unmatched, especially at high current levels (i.e. 10 mA).

As shown in FIG. 13 and summarized in Table 1, tests were performed on a stripline board configured as the module 10 having an open edge and foil tabs 20 shown in FIGS. 3 and 4, the two attenuators were matched within 19.7 dB at 10 mA (the two 10 mA lines on the graph are 19.7 dB apart at an offset frequency arbitrarily indicated as approximately "7275"). It is believed that this large attenuation difference was primarily caused by EMI leaking out the edge of the substrate 11 and re-entering the edge on the other side of the substrate 11. The column designated % O/T indicates percentages of the variations of the attenuation and tracking respectively, that are outside of arbitrary acceptance tolerance bands.

TABLE 1

| SUMMARY OF FIG. 13 ATTENUATION DATA | | | | | |
|---|---|---|---|---|---|
| | ATTENUATION | | | TRACKING | |
| CURRENT (mA) | MIN (dB) | MAX (dB) | % O/T | MAX DELTA | % O/T |
| 0 | 1.56 | 5.91 | .62 | 1.23 | 0 |
| 1 | 19.2 | 22.41 | 0 | 2.62 | 0 |
| 2 | 29.46 | 33.2 | 0 | 3.2 | 0 |
| 5 | 44.96 | 51.59 | 0 | 6.16 | 3.7 |
| 10 | 51.77 | 75.88 | 0 | 19.67 | 11.11 |

As shown in FIG. 14 and summarized in Table 2, when the stripline board was configured as the module 10 having edge plating as shown in FIGS. 8 and 9, and with the foil tabs 20 as shown in FIGS. 3 and 4, the two attenuators were matched within 6.8 dB. This difference in attenuation is believed to be primarily caused by EMI leaking through the air gap 21 from one side of the substrate 11 to another such gap 21 the other side of the substrate 11.

TABLE 2

| SUMMARY OF FIG. 14 ATTENUATION DATA | | | | | |
|---|---|---|---|---|---|
| | ATTENUATION | | | TRACKING | |
| CURRENT (mA) | MIN (dB) | MAX (dB) | % O/T | MAX DELTA | % O/T |
| 0 | 1.59 | 5.4 | 1.85 | 1.37 | 0 |
| 1 | 19.23 | 22.84 | 0 | 2.99 | 0 |
| 2 | 29.31 | 33.09 | 0 | 3.43 | 0 |
| 5 | 44.7 | 50.3 | 0 | 4.59 | 0 |
| 10 | 54.64 | 64.01 | 0 | 6.79 | 1.23 |

As shown in FIG. 15 and summarized in Table 3, when the stripline board was configured as the module 30 of FIGS. 10 and 11, having the foil sheets 32 with the connected sheet extremities 36 and the grounding tab portions 48, the two attenuators were matched within 2.6 dB. This difference in attenuation is believed to be caused primarily by differences in the two attenuator circuits themselves and not by an EMI or grounding phenomena.

TABLE 3

| SUMMARY OF FIG. 15 ATTENUATION DATA | | | | | |
|---|---|---|---|---|---|
| | ATTENUATION | | | TRACKING | |
| CURRENT (mA) | MIN (dB) | MAX (dB) | % O/T | MAX DELTA | % O/T |
| 0 | 1.54 | 5.48 | .62 | 1.11 | 0 |
| 1 | 19.19 | 21.83 | 0 | 1.87 | 0 |
| 2 | 29.55 | 32.39 | 0 | 2.4 | 0 |
| 5 | 45.07 | 49.56 | 0 | 2.59 | 0 |
| 10 | 55.33 | 63.62 | 0 | 2.58 | 0 |

In tests of several stripline boards configured as the module 30 of FIGS. 10 and 11, there has been evidence of slight decreases in insertion loss. This result suggests that the module 30 of the present invention provides better ground plane and/or component grounding than is obtained with conventional practice. There has been no indication of any performance degradation from the use of the foil sheet 32 of the present invention.

Figure 5:
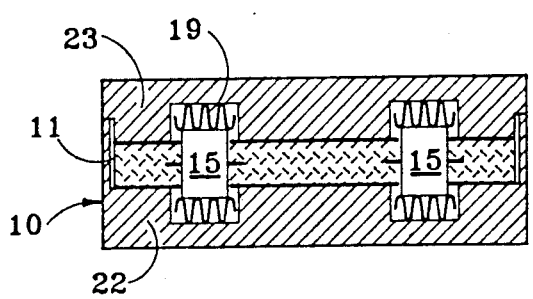
FIG. 5 is an oblique elevational sectional view showing another alternative prior art configuration of the module of FIG. 1.
Figure 6:
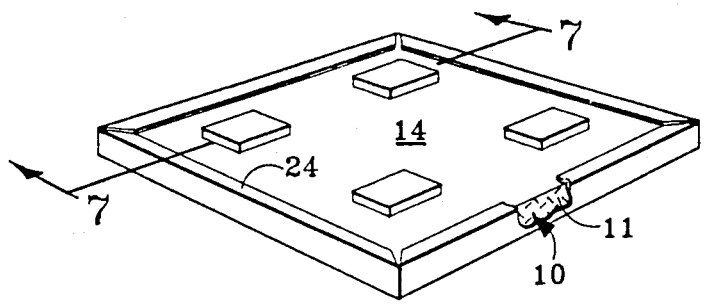
FIG. 6 is an oblique elevational perspective view showing another alternative prior art configuration of the module of FIG. 1.
Figure 7:
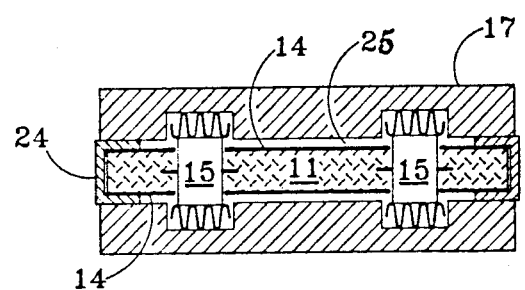
FIG. 7 is an elevational sectional view as in FIG. 2, showing the module of FIG. 6.

Although the present invention has been described in considerable detail with reference to certain preferred versions thereof, other versions are possible For example, the sheet 32 can be used in conjunction with edge plating as shown in FIGS. 8 and 9 or a metal box as shown in FIG. 5 by making the sheet 32 the same size as the stripline board 34 instead of folding the sheet 32 over the edges 38 of the board 34. The purpose of the sheet 32 would then be to ground the components 45 and not edge seal the stripline board 34. Conversely, the sheet 32 can include the extremities 36 forming the double layer 40 at the edges 38 of the board 34, with other means for grounding the components 45. Therefore, the spirit and scope of the appended claims should not necessarily be limited to the description of the preferred versions contained herein.

What is claimed is:

1. A shielded electric circuit module comprising:
   (a) substrate means including dielectric material having at least one substrate cavity formed therein for receiving a circuit element, the substrate cavity forming an opening in an external surface of the dielectric material;

(b) trace means of the substrate means for defining circuit paths to the circuit element, the trace means being electrically insulated from the external surface; and (c) a thin conductive sheet member contacting and covering the external surface, the sheet member extending at least partially over the substrate cavity for shielding at least a portion of the circuit element.

2. The apparatus of claim 1, wherein the sheet member extends beyond a marginal edge boundary of the external surface and forming an edge flap, the edge flap being formed proximately against an edge surface of the substrate means that intersects the external surface.

3. The apparatus of claim 2, wherein the substrate means forms a pair of the external surfaces on opposite sides thereof, the module comprising a pair of the sheet members.

4. The apparatus of claim 3, wherein each of the sheet members forms a corresponding edge flap, the edge flaps being in overlapping electrically conductive contact along a substantial perimeter length thereof for shielding the substrate means along the edge surface.

5. The apparatus of claim 4, wherein the overlapping edge flaps are soldered together.

6. The apparatus of claim 1, further comprising a cover member for covering the external surface, the cover member having a cover cavity formed therein for receiving a protruding portion of the circuit element together with a portion of the sheet member.

7. The apparatus of claim 6, wherein the substrate means forms a pair of the external surfaces on opposite sides thereof, the module comprising a pair of the sheet members and a pair of the cover members.

8. The apparatus of claim 6, wherein the sheet member has a sheet circuit opening therein, the sheet opening extending over a portion of the cavity for facilitating forming of the sheet member in close conformity with the protruding portion of the circuit element.

9. The apparatus of claim 8, wherein the sheet circuit opening forms an intersecting pair of slots, the slots extending proximately to opposite sides of the cavity.

10. The apparatus of claim 9, wherein the opening formed by the cavity is rectangular, the slots extending to proximate opposite corners of the opening.

11. The apparatus of claim 9, wherein the opening formed by the cavity is circular, the sheet circuit opening forming an intersecting triplet of the slots.

12. A shielded electric circuit module comprising:

(a) substrate means including dielectric material having circuit means thereon, the circuit means being electrically insulated from a pair of external surfaces formed by the substrate means; and (b) a pair of thin conductive sheet members for covering the external surfaces, the sheet members extending beyond a marginal edge boundary intersecting the external surfaces, each sheet member forming a corresponding edge flap, the edge flaps being in overlapping electrically conductive contact along a substantial perimeter length thereof for shielding the substrate means along the edge surface.

13. The apparatus of claim 12, wherein the overlapping edge flaps are soldered together.

14. A shielded electric circuit module comprising:

(a) substrate means including dielectric material having at least one substrate cavity formed therein for receiving a circuit element, the substrate cavity forming openings in a pair of external surfaces of the dielectric material;

(b) trace means of the substrate means for defining circuit paths to the circuit element, the trace means being electrically insulated from the external surface, and (c) a pair of thin conductive sheet members for covering the external surfaces, the sheet members extending at least partially over the substrate cavity for shielding at least a portion of the circuit element and extending beyond a marginal edge boundary of the external surfaces, each sheet member forming a corresponding edge flap, the edge flaps being formed proximately against an edge surface of the substrate means that intersects the external surfaces and being in overlapping electrically conductive contact along a substantial perimeter length thereof for shielding the substrate means along the edge surface;

(d) a pair of cover members for covering the external surfaces, each cover member having a cover cavity formed therein for receiving a protruding portion of the circuit element together with a portion of each of the sheet members, each sheet member having a sheet circuit opening therein forming an intersecting pair of slots extending to proximate opposite extremities of the opening for facilitating forming of the sheet members in close conformity with the protruding portion of the circuit element.

* * * * *